(12) United States Patent  (10) Patent No.: US 6,820,241 B2
Yamamoto  (45) Date of Patent: Nov. 16, 2004

(54) SEMICONDUCTOR DEVICE WITH VOLTAGE DOWN CIRCUIT CHANGING POWER SUPPLY VOLTAGE TO OPERATING VOLTAGE

(75) Inventor: Hiroshi Yamamoto, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 9 days.

(21) Appl. No.: 10/164,607

(22) Filed: Jun. 10, 2002

(65) Prior Publication Data
US 2003/0117214 A1 Jun. 26, 2003

(30) Foreign Application Priority Data
Dec. 21, 2001 (JP) ........................................ 2001-390168

(51) Int. Cl.⁷ .............................. G06F 17/50; G11C 7/00
(52) U.S. Cl. .................... 716/1; 716/2; 716/8; 365/226
(58) Field of Search .............................. 716/1–8, 10, 11, 716/12, 15–19, 21; 711/118; 396/205; 365/63, 226, 189.29, 189.05; 361/25; 345/96; 327/564, 541, 141; 323/354, 340, 316; 307/116

(56) References Cited
U.S. PATENT DOCUMENTS 5,309,399 A * 5/1994 Murotani ............... 365/189.09
6,081,673 A * 6/2000 Okubo ....................... 396/205
6,175,952 B1 * 1/2001 Patel et al. ................... 716/18
6,366,506 B1 * 4/2002 Mizuno et al. ........ 365/189.09
6,405,354 B1 * 6/2002 Itazu et al. .................... 716/8
6,460,168 B1 * 10/2002 Yamamoto et al. ............. 716/8
6,550,038 B2 * 4/2003 Shirata .......................... 716/4
6,684,378 B2 * 1/2004 Yamamoto et al. ........... 716/10

FOREIGN PATENT DOCUMENTS

JP         0590499         4/1993
JP      2003-099414 A     4/2003

* cited by examiner

Primary Examiner—Vuthe Siek
Assistant Examiner—Helen B Rossoshek
(74) Attorney, Agent, or Firm—Burns, Doane, Swecker & Mathis, L.L.P.

(57) ABSTRACT

A plurality of core chips are arranged on a body of a semiconductor device, and a plurality of voltage down circuits are arranged on the outside of the core chips to lower a power supply voltage to a plurality of operating voltages of the core chips. In cases where the operating voltages differ from each other, each core chip is connected to the corresponding voltage down circuit. In cases where the operating voltages are the same as each other, one voltage down circuit corresponding to the same operating voltage is connected to a line surrounding the core chips, and the core chips are connected to the line. In cases where the operating voltage of one core chip is equal to the power supply voltage, the core chip is directly connected to a line of the power supply voltage.

9 Claims, 5 Drawing Sheets

SEMICONDUCTOR DEVICE WITH VOLTAGE DOWN CIRCUIT CHANGING POWER SUPPLY VOLTAGE TO OPERATING VOLTAGE

BACKGROUND OF THE INVENTION

1. Field of the Invention

The present invention relates to a semiconductor device which is widely used regardless of the change in an operating voltage of a circuit element.

2. Description of Related Art

In general, a specification of a power supply voltage (or input voltage) is often changed in a semiconductor device (particularly, a semiconductor integrated circuit such as a microcomputer) without changing the function of semiconductor device. In this case, an operating voltage of the semiconductor device is, for example, obtained by using a voltage down circuit (VDC). That is, in cases where the power supply voltage is higher than the operating voltage of the semiconductor device, the power supply voltage is lowered to the operating voltage in the voltage down circuit, and the semiconductor device is operated by using electric power of the operating voltage obtained from the power supply voltage.

Therefore, even though the power supply voltage is higher than the operating voltage of the semiconductor device, it is not required to change a plurality of circuit elements composing the semiconductor device to ones suitable for the power supply voltage. As a result, a plurality of semiconductor devices having the same specification can be easily used in a semiconductor device field regardless of a difference in the power supply voltage.

FIG. 9A is a view showing the configuration of a conventional semiconductor device of a normal voltage type, and FIG. 9B is a view showing the configuration of a conventional semiconductor device of a low voltage type. In FIG. 9A and FIG. 9B, 11 indicates a substrate, 12 indicates a central processing unit (CPU), 13 indicates a timer, 14 indicates a voltage down circuit (VDC), and 15 indicates each of a plurality of input/output pads. The input/output pads 15 are arranged around a peripheral area of the substrate 11 so as to surround the CPU 12, the timer 13 and the VDC 14. Here, other peripheral functional circuits are omitted in FIG. 9A.

The conventional semiconductor device shown in FIG. 9A is used in cases where a power supply voltage is higher than an operating voltage of the CPU 12 and the timer 13 of the conventional semiconductor device, the power supply voltage is lowered to the operating voltage in the VDC 14, and electric power of the operating voltage obtained from the power supply voltage is supplied to the CPU 12 and the timer 13. This type of semiconductor device is called a normal voltage type semiconductor device in this specification.

In contrast, in cases where the power supply voltage is equal to an operating voltage of a conventional semiconductor device because the power supply voltage is low, as shown in FIG. 9B, the VDC 14 is removed from the conventional semiconductor device, and the power supply voltage is directly supplied to the CPU 12 and the timer 13 as the operating voltage. Therefore, the conventional semiconductor device shown in FIG. 9B is operated in the same manner as that of the conventional semiconductor device shown in FIG. 9A. This type of semiconductor device is called a low voltage type semiconductor device in this specification.

In cases where the normal voltage type semiconductor device is compared with the low voltage type semiconductor device, because of the difference in the existence of the VDC 14, a layout of a plurality of circuit elements (for example, the CPU 12 and the timer 13) surrounded by the input/output pads 15 in the normal voltage type semiconductor device inevitably differs from that in the low voltage type semiconductor device. Therefore, it is required to separately design both a layout of circuit elements in the normal voltage type semiconductor device and a layout of circuit elements in the low voltage type semiconductor device.

Because the conventional semiconductor devices have the above-described configurations respectively, even though a plurality of conventional semiconductor devices have the same specification, in cases where a plurality of operating voltages of the conventional semiconductor devices differ from each other, it is required to design a layout of circuit elements for each conventional semiconductor device. Therefore, in cases where a plurality of conventional semiconductor devices respectively operated at a plurality of operating voltages different from each other are used, even though the conventional semiconductor devices have the same specification, it is required to design a layout of circuit elements for each conventional semiconductor device. In this case, a problem has arisen that the conventional semiconductor devices having the same specification cannot be easily used in a semiconductor device field.

Also, in cases where electric power required in a conventional semiconductor device differs from that required in another conventional semiconductor device, even though a plurality of conventional semiconductor devices have the same specification, it is required to design a layout of circuit elements for each conventional semiconductor device. In this case, the same problem described above has arisen.

SUMMARY OF THE INVENTION

An object of the present invention is to provide, with due consideration to the drawbacks of the conventional semiconductor device, a semiconductor device which is easily used regardless of a change in an operating voltage or a required electric power.

The object is achieved by the provision of a semiconductor device which includes a circuit block having at least a circuit unit operated at a prescribed operating voltage, a voltage changing unit for changing a power supply voltage obtained from the outside to the prescribed operating voltage, and supplying means for supplying electric power of the prescribed operating voltage obtained by the voltage changing unit to the circuit unit of the circuit block. The voltage changing unit is arranged without making a connection with the circuit block.

Therefore, even though the circuit block operated at the prescribed operating voltage different from the power supply voltage is arranged in the semiconductor device, a layout of the circuit block can be fixed regardless of the operating voltage of the circuit block. Accordingly, a plurality of semiconductor devices can be widely used regardless of a difference in the operating voltages of the circuit blocks (or the circuit units).

The object is also achieved by the provision of a semiconductor device which includes a circuit block having a plurality of circuit units respectively operated at a plurality of operating voltages different from each other, a plurality of voltage changing units for changing a power supply voltage obtained from the outside to the operating voltages of the circuit units of the circuit block respectively, and supplying means for supplying the operating voltages obtained by the voltage changing units to the circuit units of the circuit block. The voltage changing units are arranged without making a connection with the circuit block.

Therefore, the circuit units operated at the operating voltages different from each other can be arranged in the semiconductor device. Accordingly, the semiconductor device can be flexibly used regardless of a difference in the operating voltages of the circuit units.

The object is also achieved by the provision of a semiconductor device which includes a circuit block having at least one circuit unit operated at a prescribed operating voltage, a plurality of voltage changing units for respectively changing a power supply voltage obtained from the outside to the prescribed operating voltage of the circuit unit of the circuit block, and supplying means for supplying electric power of the prescribed operating voltage of one voltage changing unit to the circuit unit of the circuit block and additionally supplying electric power of the prescribed operating voltage obtained by another voltage changing unit or the other voltage changing units to the circuit unit of the circuit block in a case where the electric power of the operating voltage is insufficient for the circuit unit of the circuit block. The voltage changing units are arranged without making a connection with the circuit block.

Therefore, the electric power of the operating voltage supplied to the circuit unit of the circuit block can be easily increased by adding a simple configuration of one voltage changing unit or more. Accordingly, a plurality of semiconductor devices can be widely used regardless of a difference in the electric power required in the circuit blocks (or the circuit units).

DETAILED DESCRIPTION OF THE PREFERRED EMBODIMENTS

Embodiments of the present invention will now be described with reference to the accompanying drawings.
Embodiment 1

Figure 1:
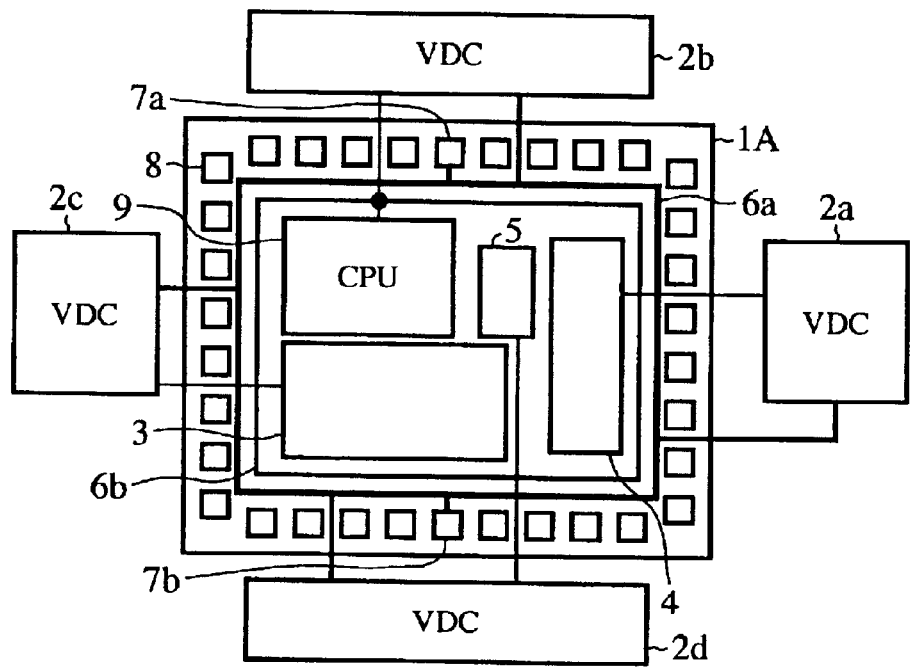
FIG. 1 is a view showing the configuration of a semiconductor device according to a first embodiment of the present invention.

FIG. 1 is a view showing the configuration of a semiconductor device according to a first embodiment of the present invention. In FIG. 1, 1A indicates a body of a semiconductor device according to the first embodiment. 3, 4, 5 and 9 indicate four core chips (or circuit blocks) mounted on the body 1A of the semiconductor device at a certain layout. For example, a central processing unit (CPU), a timer and other peripheral functional circuits are disposed on the core chips 3, 4, 5 and 9. Also, a functional block (or a circuit unit) having a prescribed function or a plurality of functional blocks (or a plurality of circuit units) having prescribed functions respectively are disposed on each of the core chips 3, 4, 5 and 9. Also, each of the functional blocks of the core chips 3, 4, 5 and 9 or each of the core chips 3, 4, 5 and 9 is operated at a prescribed operating voltage. 2a to 2d indicate four voltage down circuits (VDC) (or voltage changing units) for changing a power supply voltage supplied from the outside of the semiconductor device to the operating voltages of the core chips 3, 4, 5 and 9. In this embodiment, the operating voltages are lower than the power supply voltage. The voltage down circuits 2a to 2d are arranged on the outside of the body 1A of the semiconductor device on which the core chips 3, 4, 5 and 9 are mounted. Therefore, the voltage down circuits 2a to 2d are arranged without making a connection with a layout of the core chips 3, 4, 5 and 9. 6a indicates a normal voltage power supply line (or supplying means, power supply voltage line) surrounding the core chips 3, 4, 5 and 9, and the power supply voltage supplied from the outside is applied to the normal voltage power supply line 6a. 6b indicates a low voltage power supply line (or supplying means, operating voltage supply line) surrounding the core chips 3, 4, 5 and 9, and one operating voltage obtained from the power supply voltage in one voltage down circuit 2a, 2b, 2c or 2d is applied to the low voltage power supply line 6b. A normal voltage power supply line connecting each of the voltage down circuits 2a to 2d and the voltage power supply line 6a surrounding the core chips 3, 4, 5 and 9 is included in the normal voltage power supply line 6a, and a low voltage power supply line connecting each of the voltage down circuits 2a to 2d and the core chips 3, 4, 5 and 9 is included in the low voltage power supply line 6b. 7a and 7b indicate two power supply pads to which electric power of the power supply voltage fed from the outside of the semiconductor device is supplied. 8 indicates each of a plurality of input/output pads arranged around the core chips 3, 4, 5 and 9. The input/output pads 8 are used to connect the core chips 3, 4, 5 and 9 and external devices respectively.

Next, the supply of the operating voltages produced in the voltage down circuits 2a to 2d to the core chips 3, 4, 5 and 9 will be described below.

In a first design case of the semiconductor device, all functional blocks of each core chip of the semiconductor device are operated at the same operating voltage lower than the power supply voltage, and the operating voltages of the core chips 3, 4, 5 and 9 differ from each other. each core chip operated at an operating voltage lower than the power supply voltage is called a low voltage type of core chip, and each functional block operated at an operating voltage lower than the power supply voltage is called a low voltage type of functional block. In this case, the power supply voltage is applied to the normal voltage power supply line 6a surrounding the core chips 3, 4, 5 and 9 through the power supply pad 7a or 7b, the power supply voltage is changed to the operating voltages of the core chips 3, 4, 5 and 9 in the voltage down circuits 2a to 2d, and electric power of the operating voltages produced in the voltage down circuits 2a to 2d are supplied to the core chips 3, 4, 5 and 9 through the low voltage power supply lines 6b which connect the voltage down circuits 2a to 2d and the core chips 3, 4, 5 and 9 respectively. For example, electric power of the operating voltage produced in the voltage down circuit 2a is supplied to all functional blocks of the core chip 4, electric power of the operating voltage produced in the voltage down circuits 2b is supplied to the single low voltage power supply line 6b and all functional blocks of the core chip 9, electric power of the operating voltage produced in the voltage down circuit 2c is supplied to all functional blocks of the core chip 3, and electric power of the operating voltage produced in the voltage down circuit 2d is supplied to all functional blocks of the core chip 5.

In this embodiment, a low voltage power supply line surrounding the core chips 3, 4, 5 and 9 is only the single low voltage power supply line 6b. However, it is applicable that the core chips 3, 4, 5 and 9 be surrounded by a plurality of low voltage power supply lines connected to the voltage down circuits 2a to 2d so as to supply an operating voltage to each core chip from the corresponding voltage down circuit through the corresponding low voltage power supply line surrounding the core chips 3, 4, 5 and 9. In this case, because one low voltage power supply line corresponding to each core chip is additionally arranged to apply one operating voltage to the core chip through the low voltage power supply line, it is not required to change the layout of the core chips 3, 4, 5 and 9. Therefore, a layout area of the core chips 3, 4, 5 and 9 can be efficiently used.

In a second design case of the semiconductor device, all functional blocks of each core chip of the semiconductor device are operated at the same operating voltage lower than the power supply voltage, and the operating voltages of the core chips 3, 4, 5 and 9 are the same as each other. In this case, the voltage down circuit 2b is, for example, connected to the low voltage power supply line 6b surrounding the core chips 3, 4, 5 and 9, each of the core chips 3, 4, 5 and 9 is connected to the low voltage power supply line 6b surrounding the core chips 3, 4, 5 and 9, and no low voltage power supply lines connect the other voltage down circuits 2a, 2c and 2d and the core chips 3, 4, 5 and 9 respectively. Therefore, the layout of the core chips 3, 4, 5 and 9 in the second design case is the same as that in the first design case.

In the above configuration of the semiconductor device corresponding to the second design case, electric power of the operating voltage produced in the voltage down circuit 2b from the power supply voltage is supplied to the low voltage power supply line 6b surrounding the core chips 3, 4, 5 and 9, and electric power of the operating voltage of the low voltage power supply line 6b is supplied to the core chips 3, 4, 5 and 9. Therefore, the core chips 3, 4, 5 and 9 can be operated by merely arranging the power supply line 6b connecting one voltage down circuit 2a, 2b, 2c or 2d and the core chips 3, 4, 5 and 9, and a layout area of the core chips 3, 4, 5 and 9 can be further efficiently used.

Figure 2:
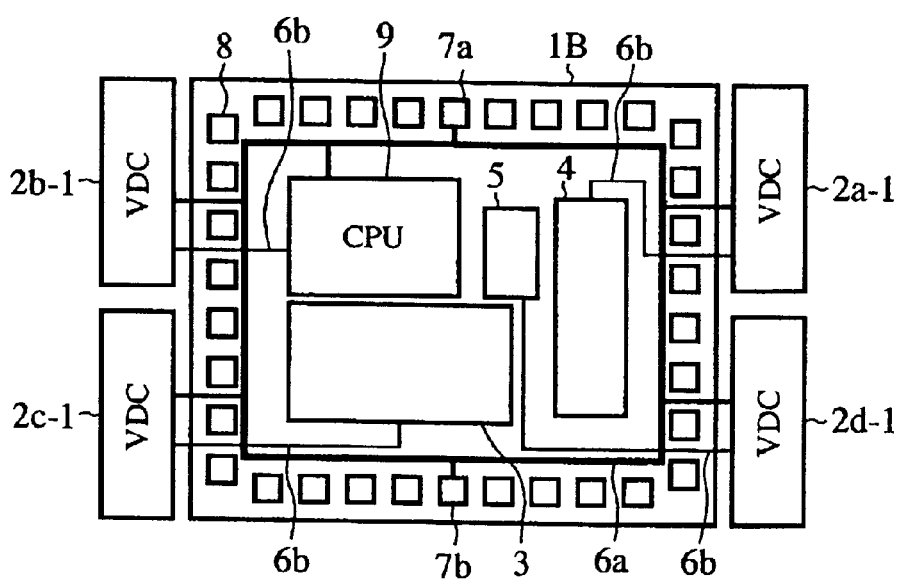
FIG. 2 is a view showing the configuration of another semiconductor device corresponding to a third design case according to the first embodiment of the present invention.

FIG. 2 is a view showing the configuration of another semiconductor device corresponding to a third design case according to the first embodiment. The constituent elements, which are the same as those shown in FIG. 1, are indicated by the same reference numerals as those of the constituent elements shown in FIG. 1, and additional description of those constituent elements is omitted.

In FIG. 2, 1B indicates a body of a semiconductor device according to the first embodiment. 2a-1 to 2d-1 indicate four voltage down circuits (VDC) (or voltage changing units) for changing a power supply voltage supplied from the outside to the operating voltages of the core chips 3, 4, 5 and 9. The voltage down circuits 2a-1 to 2d-1 are arranged on the outside of the body 1B of the semiconductor device on which the core chips 3, 4, 5 and 9 are mounted. Therefore, the voltage down circuits 2a-1 to 2d-1 are arranged without making a connection with a layout of the core chips 3, 4, 5 and 9.

In a third design case of the semiconductor device, one functional block disposed on one of the core chips 3, 4, 5 and 9 (or a plurality of functional blocks disposed on the core chips 3, 4, 5 and 9) is operated at an operating voltage equal to the power supply voltage. Each functional block operated at an operating voltage equal to the power supply voltage is called a normal voltage type of functional block. For example, a specific functional block of the CPU disposed in the core chip 9 is operated when the power supply voltage is supplied to the specific functional block of the CPU as an operating voltage through the normal voltage power supply line 6a. The other functional blocks of the core chip 9 are operated at an operating voltage lower than the power supply voltage, all functional blocks of each core chip 3, 4 or 5 is operated at an operating voltage lower than the power supply voltage, and the operating voltages of the core chips 3, 4, 5 and 9 lower than the power supply voltage differ from each other.

In the third design case, as shown in FIG. 2, the specific functional block of the CPU disposed in the core chip 9 is directly connected to the normal voltage power supply line 6a surrounding the core chips 3, 4, 5 and 9, the other functional blocks of the core chip 9 is connected to the voltage down circuit 2b-1 through the low voltage power supply line 6b, and the core chips 3, 4 and 5 are connected to the voltage down circuits 2c-1, 2a-1 and 2d-1 through the low voltage power supply lines 6b respectively. Therefore, the layout of the core chips 3, 4, 5 and 9 in the third design case is the same as that in the first design case shown in FIG. 1.

In the configuration of the semiconductor device corresponding to the third design case, electric power of the power supply voltage is directly supplied to the specific functional block of the core chip 9 from the normal voltage power supply line 6a surrounding the core chips 3, 4, 5 and 9. Also, electric power of the operating voltage obtained in the voltage down circuits 2b-1 is supplied to the other functional blocks of the core chip 9, and electric power of the operating voltages obtained in the voltage down circuits 2c-1, 2a-1 and 2d-1 is supplied to the functional blocks of the core chips 3, 4 and 5 respectively.

Also, in a fourth design case of the semiconductor device, a specific functional block of the CPU disposed in the core chip 9 is operated when the power supply voltage is supplied to the specific functional block of the CPU as an operating voltage through the normal voltage power supply line 6a surrounding the core chips 3, 4, 5 and 9. The other functional blocks of the core chip 9 are operated at an operating voltage lower than the power supply voltage, all functional blocks of each core chip 3, 4 or 5 is operated at an operating voltage lower than the power supply voltage, and the operating voltages of the core chips 3, 4, 5 and 9 lower than the power supply voltage are the same as each other.

In this design case, in the same manner as in the first design case shown in FIG. 1, a low voltage power supply line surrounding the core chips 3, 4, 5 and 9 is arranged on the body 1B of the semiconductor device, one voltage down circuit 2a-1, 2b-1, 2c-1 or 2d-1, in which the same operating voltage of the core chips 3, 4, 5 and 9 is produced, is connected to the low voltage power supply line, and each of the core chips 3, 4, 5 and 9 is connected to the low voltage power supply line. Therefore, the layout of the core chips 3, 4, 5 and 9 in the fourth design case is the same as that in the first design case shown in FIG. 1.

Also, in a fifth design case of the semiconductor device, all functional blocks of a specific core chip 3, 4, 5 or 9 are operated at an operating voltage equal to the power supply voltage. Each core chip operated at an operating voltage equal to the power supply voltage is called a normal voltage type of core chip. In this design case, the voltage down circuit 2a-1, 2b-1, 2c-1 or 2d-1 corresponding to the specific core chip is not arranged in the semiconductor device. Therefore, the layout of the core chips 3, 4, 5 and 9 in the fifth design case is the same as that in the first design case shown in FIG. 1, and a small-sized semiconductor device can be obtained.

Also, in a sixth design case, a plurality of functional blocks of a specific core chip 3, 4, 5 or 9 are operated at operating voltages different from each other and lower than the power supply voltage. In this design case, the functional blocks of the specific core chip 3, 4, 5 or 9 are connected to a plurality of voltage down circuits (not shown) arranged on the outside of the core chips 3, 4, 5 and 9 respectively. Therefore, the layout of the core chips 3, 4, 5 and 9 in the sixth design case is the same as that in the first design case shown in FIG. 1.

In the configuration of the semiconductor device corresponding to the sixth design case, a plurality of operating voltages different from each other are supplied to the functional blocks of the specific core chip 3, 4, 5 or 9 from the voltage down circuits.

As is described above, in the first embodiment, the voltage down circuits 2a-1 to 2d-1, in which the power supply voltage is changed to the prescribed operating voltages, are arranged without making a connection with the layout of the core chips 3, 4, 5 and 9. Therefore, the layout of the core chips 3, 4, 5 and 9 can be fixed regardless of whether each core chip is operated at the operating voltage lower than or equal to the power supply voltage. Accordingly, because it is not required to design a layout of core chips for each of a plurality of semiconductor devices having the same operation function, a plurality of semiconductor devices having the same operation function can be easily used regardless of a difference in operating voltage of the core chips of the semiconductor devices.

Also, in the first embodiment, in cases where one core chip is used as a normal voltage type core chip operated at the power supply voltage, it is not required to arrange a voltage down circuit for the core chip. Therefore, a plurality of semiconductor devices having the same operation function can be easily used by only adjusting the number of voltage down circuits regardless of whether each core chip of the semiconductor devices is used as a normal voltage type core chip.

Also, in the first embodiment, a plurality of voltage down circuits corresponding to a plurality of functional blocks of each core chip operated at operating voltages different from each other are arranged without making a connection with the layout of the core chips 3, 4, 5 and 9 to change the power supply voltage to the operating voltages of the functional blocks. Therefore, a plurality of functional blocks operated at operating voltages different from each other can be arranged in each core chip of a semiconductor device. Accordingly, a plurality of semiconductor devices having the same operation function can be flexibly used regardless of a difference in operating voltage of the functional blocks of each core chip.

Embodiment 2

Figure 3:
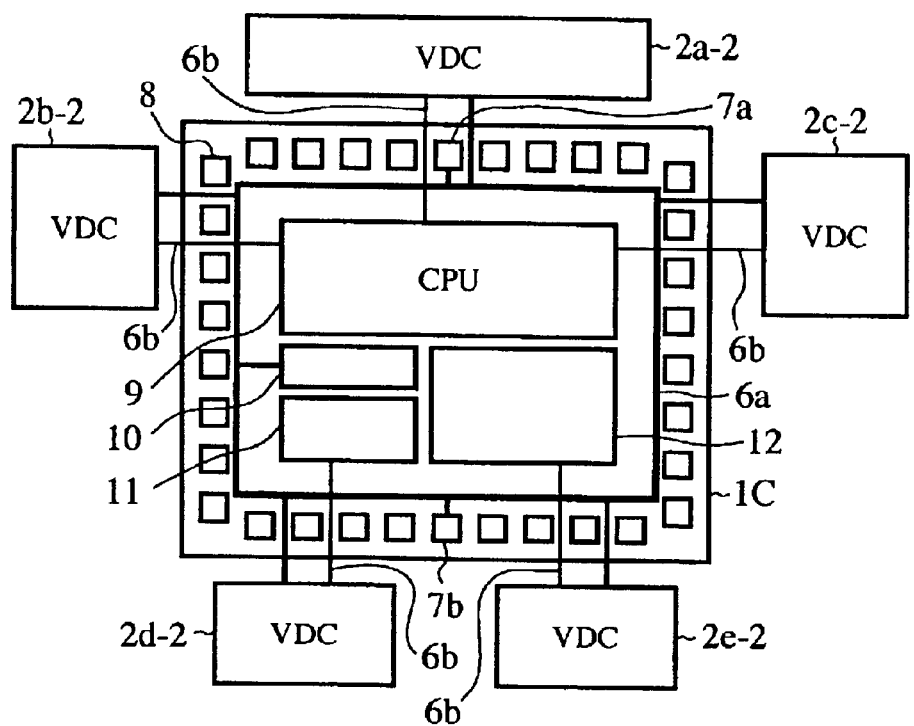
FIG. 3 is a view showing the configuration of a semiconductor device according to a second embodiment of the present invention.

FIG. 3 is a view showing the configuration of a semiconductor device according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 3, 1C indicates a body of a semiconductor device according to the second embodiment. 9, 10, 11 and 12 indicate four core chips (or circuit blocks) mounted on the body 1C of the semiconductor device. For example, a central processing unit (CPU), a timer and other peripheral functional circuits are disposed on the core chips 9 to 12. Also, a functional block (or a circuit unit) having a prescribed function or a plurality of functional blocks (or a plurality of circuit units) having prescribed functions respectively are disposed on each of the core chips 9 to 12. Also, each of the functional blocks of the core chips 9 to 12 or each of the core chips 9 to 12 is operated at a prescribed operating voltage. 2a-2 to 2e-2 indicate five voltage down circuits (VDC) (or voltage changing units) for changing a power supply voltage supplied from the outside of the semiconductor device to the operating voltages of the core chips 9, 11 and 12. The voltage down circuits 2a-2 to 2e-2 are arranged on the outside of the core chips 9 to 12. Therefore, the voltage down circuits 2a-2 to 2e-2 are arranged without making a connection with a layout of the core chips 9 to 12.

All functional blocks disposed in the core chip 10 are operated at an operating voltage equal to the power supply voltage. Therefore, the core chip 10 is directly connected to the high voltage power supply line 6a. All functional blocks disposed in each core chip 9, 11 or 12 are operated at an operating voltage lower than the power supply voltage, and the operating voltages of the core chips 9, 11 and 12 differ from each other. The operating voltage of the functional blocks disposed in the core chip 9 is produced in each of the voltage down circuits 2a-2 to 2c-2, the operating voltage of the functional blocks disposed in the core chip 11 is produced in the voltage down circuits 2d-2, and the operating voltage of the functional blocks disposed in the core chip 12 is produced in the,voltage down circuits 2e-2.

In an initial design case, the core chip 9 is, for example, connected to the voltage down circuit 2a-2 through one low voltage power supply line 6b, but the core chip 9 is not connected to the voltage down circuit 2b-2 or the voltage down circuit 2c-2. Also, the core chip 11 is connected to the voltage down circuits 2d-2 through one low voltage power supply line 6b, and the core chip 12 is connected to the voltage down circuits 2e-2 through one low voltage power supply line 6b.

Next, the supply of the operating voltages produced in the voltage down circuits 2a-2 to 2e-2 to the core chips 9, 11 and 12 will be described below.

The power supply voltage supplied to the high voltage power supply line 6a through the power supply pad 7a or 7b is changed to the operating voltage of the core chip 9 in the voltage down circuits 2a-2, 2b-2 and 2c-2. Also, the power supply voltage is changed to the operating voltages of the core chips 11 and 12 in the voltage down circuits 2d-2 and 2e-2. Thereafter, in the same manner as in the first embodiment, electric power of the operating voltage produced in the voltage down circuit 2a-2 is supplied to the core chip 9 through one low voltage power supply line 6b, electric power of the operating voltage produced in the voltage down circuit 2d-2 is supplied to the core chip 11 through one low voltage power supply line 6b, and electric power of the operating voltage produced in the voltage down circuit 2e-2 is supplied to the core chip 12 through one low voltage power supply line 6b.

In cases where the design of the semiconductor device is changed, before delivering the semiconductor device to a customer, it is checked in an estimating step whether or not the electric power supplied to the core chip 9 by the voltage down circuit 2a-2 is sufficient. In cases where the electric power supplied to the core chip 9 is insufficient, the core chip 9 is additionally connected to the voltage down circuit 2b-2 or 2c-2 or the voltage down circuits 2b-2 and 2c-2 through the corresponding low voltage power supply line 6b or the corresponding low voltage power supply lines 6b.

Also, in cases where it is recognized that the electric power supplied to the core chip 9 is insufficient in the initial design case, the core chip 9 is additionally connected to the voltage down circuit 2b-2 or 2c-2 or the voltage down circuits 2b-2 and 2c-2 through the corresponding low voltage power supply line 6b or the corresponding low voltage power supply lines 6b. Also, in cases where a specification of the core chip 9 is changed so as to increase the electric power required in the core chip 9, the core chip 9 is additionally connected to the voltage down circuit 2b-2 or 2c-2 or the voltage down circuits 2b-2 and 2c-2 through the corresponding low voltage power supply line 6b or the corresponding low voltage power supply lines 6b.

Thereafter, the electric power of the operating voltage produced in the voltage down circuits 2a-2 and 2b-2, 2a-2 and 2c-2, or 2a-2 to 2c-2 is supplied to the core chip 9. Therefore, the electric power supplied to the core chip 9 can be backup by the core chips 2b-2 and/or 2c-2, and the electric power supplied to each core chip can be changed without changing the layout of the chip cores 9 to 12.

Figure 4:
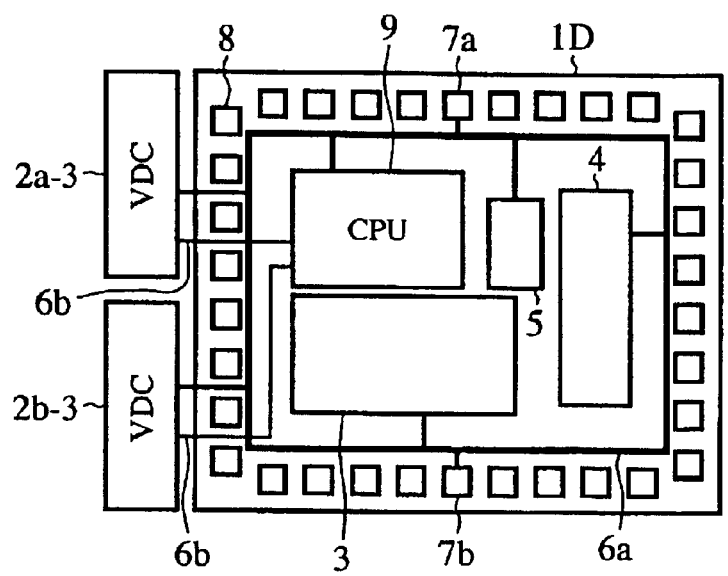
FIG. 4 is a view showing the configuration of another semiconductor device according to the second embodiment of the present invention.

FIG. 4 is a view showing the configuration of another semiconductor device according to the second embodiment of the present invention. The constituent elements, which are the same as those shown in FIG. 1, are indicated by the same reference numerals as those of the constituent elements shown in FIG. 1, and additional description of those constituent elements is omitted.

In FIG. 4, 1D indicates a body of a semiconductor device according to the second embodiment. 2a-3 and 2b-3 indicate two voltage down circuits (VDC) (or voltage changing units) for respectively changing a power supply voltage supplied from the outside of the semiconductor device to an operating voltage of a first group of functional blocks of the core chip 9. The voltage down circuits 2a-3 and 2b-3 are arranged on the outside of the body 1D of the semiconductor device on which the core chips 3, 4, 5 and 9 are mounted. Therefore, the voltage down circuits 2a-3 and 2b-3 are arranged without making a connection with a layout of the core chips 3, 4, 5 and 9.

In the semiconductor device shown in FIG. 4, the first group of functional blocks disposed on the core chip 9 is operated at an operating voltage lower than the power supply voltage, the other group of functional blocks of the core chip 9 and all functional blocks of the core chips 3, 4 and 5 are operated at an operating voltage equal to the power supply voltage. Therefore, in an initial design case, the first group of functional blocks of the core chip 9 is connected to the voltage down circuit 2a-3 through the corresponding low voltage power supply line 6b, but the first group of functional blocks of the core chip 9 is not connected to the voltage down circuit 2b-3. Also, the other group of functional blocks of the core chip 9 and all functional blocks of the core chips 3 to 5 are directly connected to the high voltage power supply line 6a surrounding the core chips 3, 4, 5 and 9, and no voltage down circuit is prepared for the core chips 3 to 5.

Next, an operation will be described below.

The power supply voltage supplied to the high voltage power supply line 6a through the power supply pad 7a or 7b is changed to the operating voltage of the specific functional block of the core chip 9 in the voltage down circuits 2a-3 and 2b-3. Thereafter, in the same manner as in the first embodiment, electric power of the operating voltage produced in the voltage down circuit 2a-3 is supplied to the first group of functional blocks of the core chip 9 through one low voltage power supply line 6b, and electric power of the power supply voltage is directly supplied from the high voltage power supply line 6a to the other group of functional blocks of the core chip 9 and all functional blocks of the core chips 3 to 5.

In cases where the design of the semiconductor device is changed, before delivering the semiconductor device to a customer, it is checked in an estimating step whether or not the electric power supplied to the first group of functional blocks of the core chip 9 by the voltage down circuit 2a-3 is sufficient. In cases where the electric power supplied to the first group of functional blocks of the core chip 9 is insufficient, the first group of functional blocks of the core chip 9 is additionally connected to the voltage down circuit 2b-3 through the corresponding low voltage power supply line 6b.

Also, in cases where it is recognized that the electric power supplied to the first group of functional blocks of the core chip 9 is insufficient in the initial design case, the first group of functional blocks of the core chip 9 is additionally connected to the voltage down circuit 2b-3 through the corresponding low voltage power supply line 6b. Also, in cases where a specification of the first group of functional blocks of the core chip 9 is changed so as to add a functional block to the first group of functional blocks in the core chip 9, the added functional block of the core chip 9 is additionally connected to the voltage down circuit 2b-3 through the corresponding low voltage power supply line 6b.

Thereafter, the electric power of the operating voltage produced in the voltage down circuits 2a-3 and 2b-3 is supplied to the core chip 9. Therefore, the electric power supplied to the core chip 9 can be backup by the core chip 2b-3, and the electric power supplied to each core chip can be changed without changing the layout of the chip cores 3, 4, 5 and 9.

As is described above, in the second embodiment, in cases where the electric power supplied to one functional block (or a plurality of functional blocks) of one core chip from one voltage down circuit is insufficient, the electric power is additionally supplied to the functional block (or the functional blocks) of the core chip from another voltage down circuit (or other voltage down circuits). Accordingly, because the electric power supplied to a specific core chip (or a specific functional block of a core chip) can be changed without changing the layout of the core chips, a plurality of semiconductor devices having the same operation function can be easily used regardless of a difference in the electric power required in the specific core chip (or the specific functional block of the core chip).

Also, in the second embodiment, because no voltage down circuit is arranged for the functional blocks operated at the operating voltage equal to the power supply voltage, a small-sized semiconductor device can be obtained.

Also, in the second embodiment, because it is not required to design a layout of core chips for each of a plurality of semiconductor devices having the same operation function, a plurality of semiconductor devices having the same operation function can be easily used regardless of a difference in operating voltage of the core chip.

Embodiment 3

Figure 5:
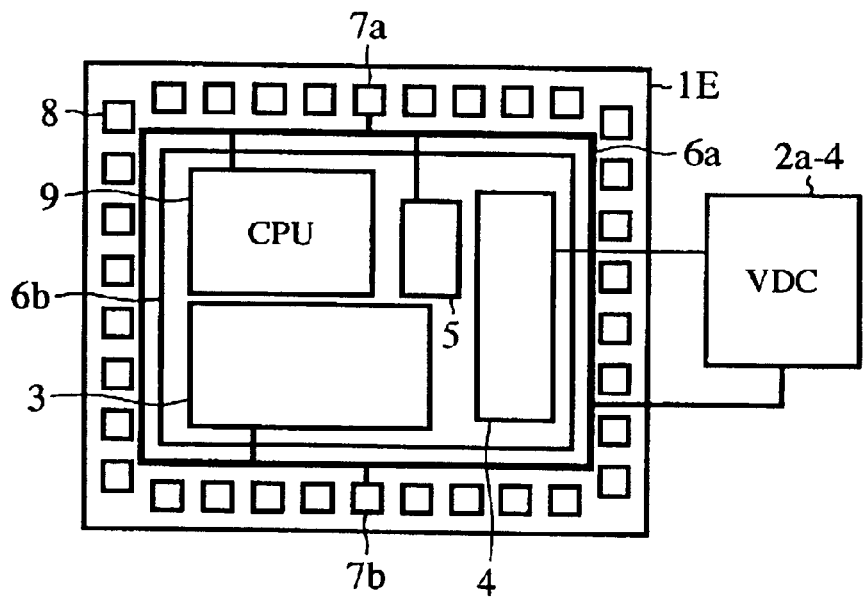
FIG. 5 is a view showing the configuration of a semiconductor device corresponding to a first design case according to a third embodiment of the present invention.
Figure 6:
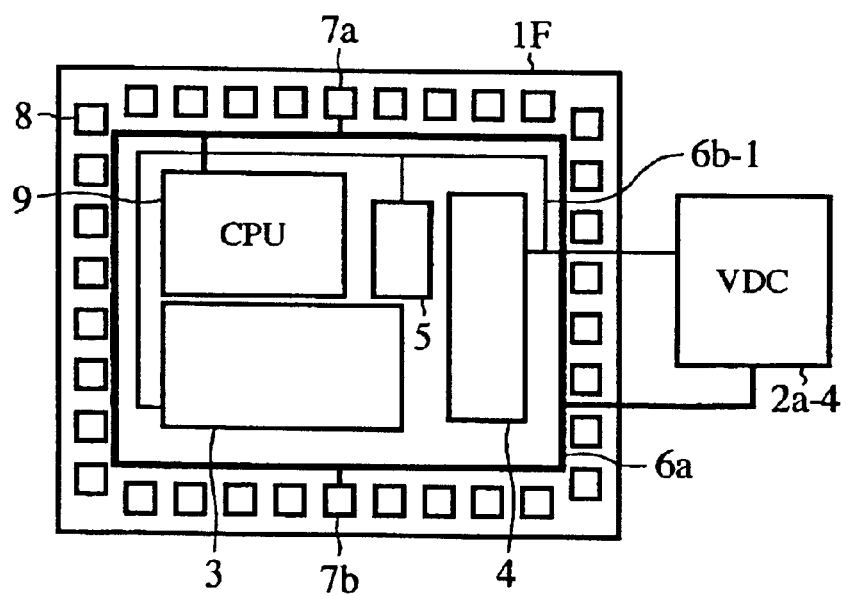
FIG. 6 is a view showing the configuration of a semiconductor device corresponding to a second design case according to the third embodiment of the present invention.
Figure 7:
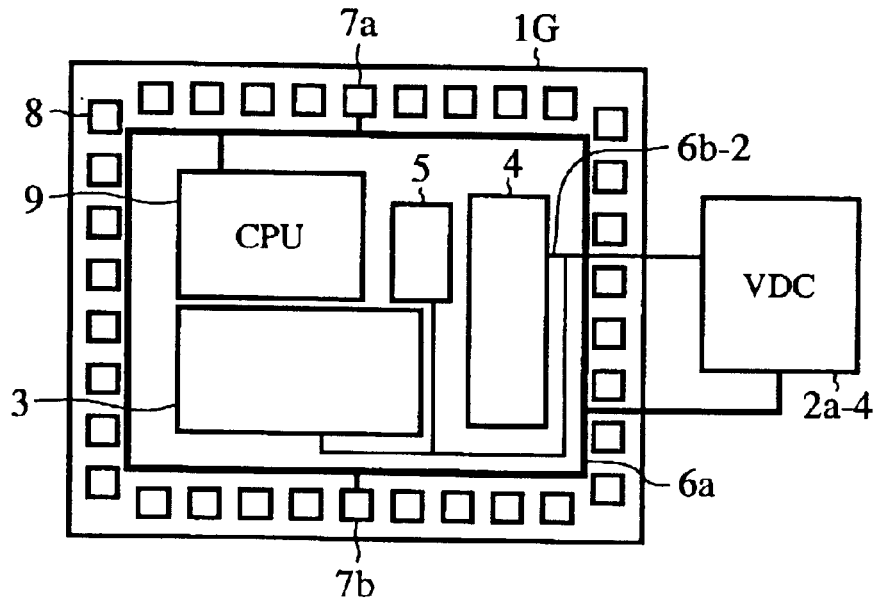
FIG. 7 is a view showing the configuration of another semiconductor device corresponding to the second design case according to the third embodiment of the present invention.
Figure 8:
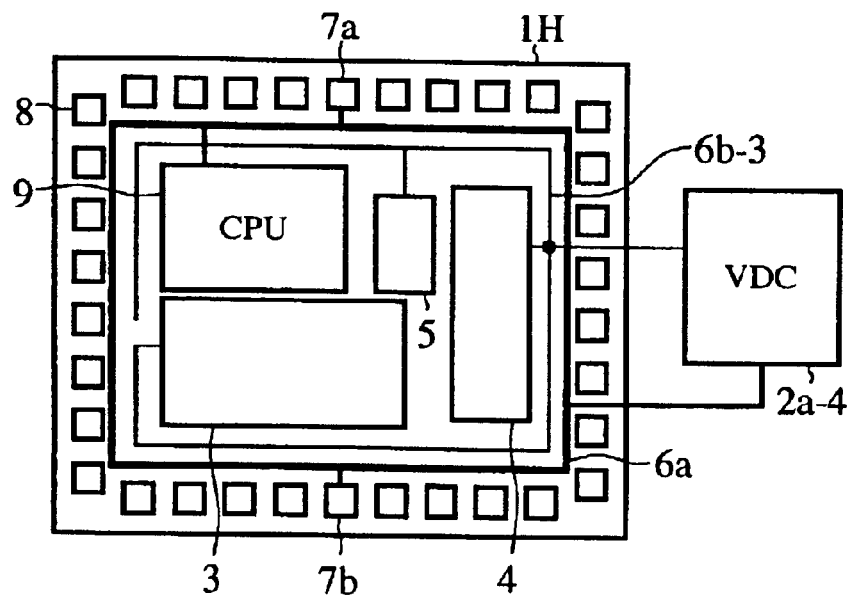
FIG. 8 is a view showing the configuration of another semiconductor device corresponding to the second design case according to the third embodiment of the present invention.
Figure 9A:
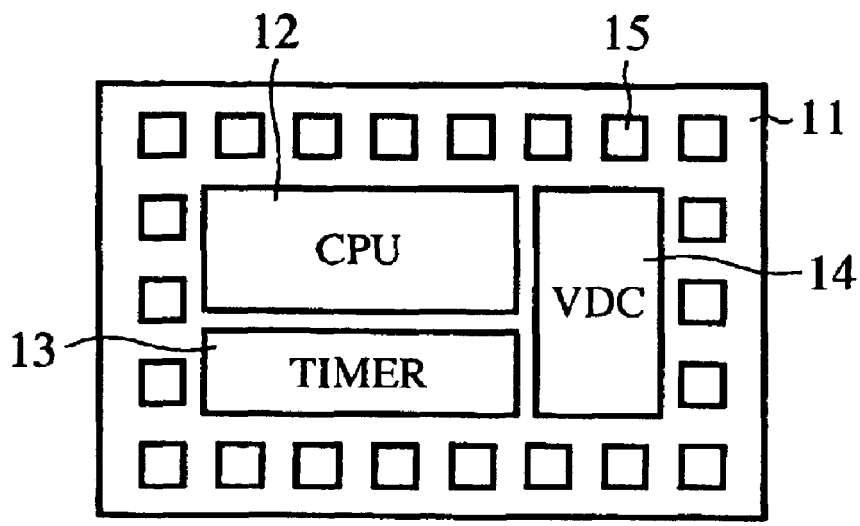
FIG. 9A is a view showing the configuration of a conventional semiconductor device of a normal voltage type.
Figure 9B:
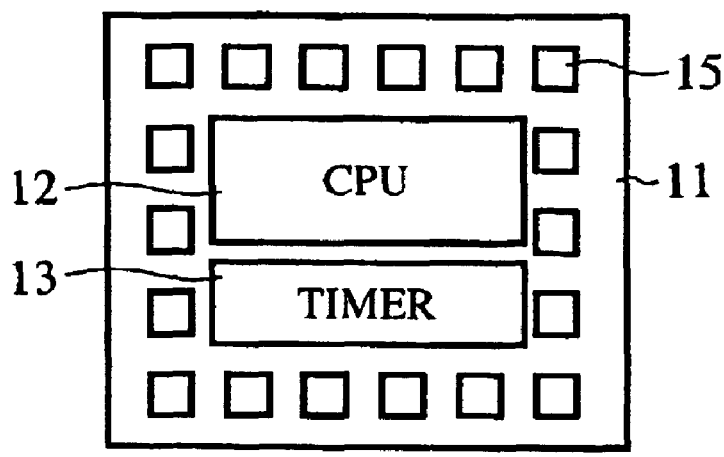
FIG. 9B is a view showing the configuration of a conventional semiconductor device of a low voltage type.

FIG. 5 is a view showing the configuration of a semiconductor device corresponding to a first design case according to a third embodiment of the present invention, FIG. 6 is a view showing the configuration of a semiconductor device corresponding to a second design case according to the third embodiment of the present invention, FIG. 7 is a view showing the configuration of another semiconductor device corresponding to the second design case according to the third embodiment of the present invention, and FIG. 8 is a view showing the configuration of another semiconductor device corresponding to the second design case according to the third embodiment of the present invention. The constituent elements, which are the same as those shown in FIG. 1, are indicated by the same reference numerals as those of the constituent elements shown in FIG. 1, and additional description of those constituent elements is omitted.

In FIG. 5, FIG. 6, FIG. 7 and FIG. 8, 1E, 1F, 1G and 1H respectively indicate a body of a semiconductor device according to the third embodiment. 2a-4 indicates a voltage down circuit (VDC) (or voltage changing units) for changing a power supply voltage supplied from the outside of the semiconductor device to the operating voltage of the core chip 4 or the core chips 3, 4 and 5. The voltage down circuit 2a-4 is arranged on the outside of the body of the semiconductor device on which the core chips 3, 4, 5 and 9 are mounted. Therefore, the voltage down circuit 2a-4 is arranged without making a connection with a layout of the core chips 3, 4, 5 and 9.

Also, in FIG. 6, FIG. 7 and FIG. 8, 6b-1, 6b-2 and 6b-3 respectively indicate a low voltage power supply line (or supplying means) through which electric power of the operating voltage produced in the voltage down circuit 2a-4 is supplied to the core chips 3, 4 and 5.

Next, an operation will be described below.

In a first design case, the core chips 3, 5 and 9 are operated at the same operating voltage equal to the power supply voltage, and the core chip 4 is operated at an operating voltage lower than the power supply voltage. Therefore, in the semiconductor device shown in FIG. 5, the core chips 3, 5 and 9 are directly connected to the high voltage power supply line 6a surrounding the core chips 3, 4, 5 and 9, and the core chip 4 is connected to the voltage down circuit 2a-4 through the low voltage power supply line 6b.

In this design case, the power supply voltage supplied to the high voltage power supply line 6a through the power supply pad 7a or 7b is changed to the operating voltage of the core chip 4 in the voltage down circuit 2a-4. Thereafter, electric power of the operating voltage produced in the voltage down circuit 2a-4 is supplied to the core chip 4 through the low voltage power supply line 6b, and electric power of the power supply voltage is directly supplied from the high voltage power supply line 6a to the core chips 3, 5 and 9.

Therefore, because the single operating voltage is required in the semiconductor device, the single voltage down circuit 2a-4 is arranged in the semiconductor device. Also, because the single high voltage power supply line 6a surrounding the core chips 3, 4, 5 and 9 is arranged in the semiconductor device to supply the electric power of the power supply voltage to the core chips 3, 5 and 9, an area for the voltage down circuit can be reduced, and an area of the body of the semiconductor device can be efficiently used for the core chips 3, 4, 5 and 9.

Also, in a second design case, the core chip 9 is operated at the operating voltage equal to the power supply voltage, and the core chips 3, 4 and 5 are operated at the same operating voltage lower than the power supply voltage. Therefore, in the semiconductor device shown in FIG. 6, the core chip 9 is directly connected to the high voltage power supply line 6a surrounding the core chips 3, 4, 5 and 9, and the core chips 3, 4 and 5 are respectively connected to the voltage down circuit 2a-4 through the low voltage power supply line 6b-1. The low voltage power supply line 6b-1 is mainly arranged on one side (the upper side in FIG. 6) of the body 1F of the semiconductor device.

In this design case, electric power of the operating voltage produced in the voltage down circuit 2a-4 is supplied to the core chips 3, 5 and 9 through the low voltage power supply line 6b-1, and electric power of the power supply voltage is directly supplied from the high voltage power supply line 6a to the core chip 9.

Therefore, even though there are a plurality of core chips operated at operating voltages lower than the power supply voltage, in cases where the operating voltages of the core chips are the same as each other, the core chips can be operated by using the single low voltage power supply line 6b-1 arranged on one side of the body of the semiconductor device, and it is not required to change the layout of all core chips. Accordingly, an area of the body of the semiconductor device can be efficiently used for the core chips 3, 4, 5 and 9.

Also, in another second design case, in the semiconductor device shown in FIG. 7, the core chip 9 is directly connected to the high voltage power supply line 6a surrounding the core chips 3, 4, 5 and 9, and the core chips 3, 4 and 5 are respectively connected to the voltage down circuit 2a-4 through the low voltage power supply line 6b-2. The low voltage power supply line 6b-2 is mainly arranged on the other side (the lower side in FIG. 7) of the body 1G of the semiconductor device.

Also, in another second design case, in the semiconductor device shown in FIG. 8, the core chip 9 is directly connected to the high voltage power supply line 6a surrounding the core chips 3, 4, 5 and 9, and the core chips 3, 4 and 5 are respectively connected to the voltage down circuit 2a-4 through the low voltage power supply line 6b-3. The low voltage power supply line 6b-3 is arranged on the body 1F of the semiconductor device so as to almost surround the core chips 3, 4, 5 and 9.

Therefore, in cases where there are a plurality of core chips operated at the same operating voltage lower than the power supply voltage, the core chips can be connected to the voltage down circuit 2a-4 through one low voltage power supply line arbitrarily arranged on the body of the semiconductor device, and an area of the body of the semiconductor device can be efficiently used for the core chips 3, 4, 5 and 9.

What is claimed is:

1. A semiconductor device, comprising:
   a circuit block having a circuit unit, which is operated at a prescribed operating voltage which is different from a power supply voltage;
   a voltage changing unit, located external to pad arrays in the semiconductor device, for changing the power supply voltage obtained from outside the pad arrays in the semiconductor device to the prescribed operating voltage of the circuit unit of the circuit block; and supplying means for supplying electric power of the prescribed operating voltage obtained by the voltage changing unit to the circuit unit of the circuit block.

2. A semiconductor device according to claim 1, further comprising a second circuit block having a circuit unit which is operated at an operating voltage equal to the power supply voltage, wherein the supplying means comprises a first power supply voltage line surrounding both the circuit block and the second circuit block and a second power supply voltage line connecting the first power supply voltage line and the circuit unit of the second circuit block.

3. A semiconductor device, comprising:
   a circuit block having a plurality of circuit units, which are respectively operated at a plurality of operating voltages different from each other;
   a plurality of voltage changing units, located external to pad arrays in the semiconductor device, for changing a power supply voltage obtained from outside the pad arrays in the semiconductor device to the operating voltages of the circuit units of the circuit block respectively; and
   supplying means for supplying the operating voltages obtained by the voltage changing units to the circuit units of the circuit block.

4. A semiconductor device according to claim 3, wherein the supplying means comprises a plurality of operating voltage supply lines respectively connecting one voltage changing unit and the corresponding circuit unit of the circuit block.

5. A semiconductor device according to claim 3, wherein the operating voltages of the circuit units of the circuit block are the same as each other, and the supplying means comprises a first operating voltage supply line surrounding the circuit units of the circuit block, a second operating voltage supply line connecting the voltage changing unit corresponding to the same operating voltage and the first operating voltage supply line and a plurality of third operating voltage supply lines respectively connecting the first operating voltage supply line and the corresponding circuit unit of the circuit block.

6. A semiconductor device according to claim 3, wherein the operating voltages of the circuit units of the circuit block are the same as each other, and the supplying means comprises a first operating voltage supply line arranged on one side of the circuit units of the circuit block, a second operating voltage supply line connecting the voltage changing unit corresponding to the same operating voltage and the first operating voltage supply line and a plurality of third operating voltage supply lines respectively connecting the first operating voltage supply line and the corresponding circuit unit of the circuit block.

7. A semiconductor device according to claim 3, further comprising a second circuit block having a circuit unit which is operated at an operating voltage equal to the power supply voltage, wherein the supplying means comprises a first power supply voltage line surrounding both the circuit block and the second circuit block and a second power supply voltage line connecting the first power supply voltage line and the circuit unit of the second circuit block.

8. A semiconductor device, comprising:
   a circuit block having a circuit unit, which is operated at a prescribed operating voltage;
   a plurality of voltage changing units, arranged without making a connection with the circuit block, for respectively changing a power supply voltage obtained from outside pad arrays in the semiconductor device to the prescribed operating voltage of the circuit unit of the circuit block; and
   supplying means for supplying electric power of the prescribed operating voltage, which is obtained by a specific voltage changing unit selected from the plurality of voltage changing units, to the circuit unit of the circuit block and additionally supplying electric power of the prescribed operating voltage obtained by another voltage changing unit or the other voltage changing units to the circuit unit of the circuit block in a case where the electric power of the operating voltage obtained by the specific voltage changing unit is insufficient for the circuit unit of the circuit block.

9. A semiconductor device according to claim 8, further comprising a second circuit block having a circuit unit which is operated at an operating voltage equal to the power supply voltage, wherein the supplying means comprises a first power supply voltage line surrounding both the circuit block and the second circuit block and a second power supply voltage line connecting the first power supply voltage line and the circuit unit of the second circuit block.

* * * * *